US008432299B2

(12) United States Patent
Richter

(10) Patent No.: US 8,432,299 B2
(45) Date of Patent: Apr. 30, 2013

(54) INPUT PANEL AND SWITCH DEVICE FOR THE OPERATION OF AN ELECTRICAL APPLIANCE

(75) Inventor: Wolfgang Richter, Starnberg (DE)

(73) Assignee: Ident Technology AG, Wessling (DE)

( * ) Notice: Subject to any disclaimer, the term of this patent is extended or adjusted under 35 U.S.C. 154(b) by 413 days.

(21) Appl. No.: 12/446,707

(22) PCT Filed: Oct. 6, 2008

(86) PCT No.: PCT/EP2008/008421
§ 371 (c)(1),
(2), (4) Date: Mar. 23, 2010

(87) PCT Pub. No.: WO2009/046951
PCT Pub. Date: Apr. 16, 2009

(65) Prior Publication Data
US 2010/0182166 A1    Jul. 22, 2010

(30) Foreign Application Priority Data

Oct. 5, 2007   (DE) .......................... 10 2007 047 599

(51) Int. Cl.
*H03M 11/00*      (2006.01)

(52) U.S. Cl.
USPC ............................................. 341/20; 341/22

(58) Field of Classification Search .................... 341/20, 341/22, 33; 345/173–178
See application file for complete search history.

(56) References Cited

U.S. PATENT DOCUMENTS

| 4,264,903 | A  | * | 4/1981  | Bigelow ............................. 341/1 |
| 7,148,704 | B2 | * | 12/2006 | Philipp ........................... 324/686 |
| 7,639,234 | B2 | * | 12/2009 | Orsley ............................ 345/156 |
| 7,808,490 | B2 | * | 10/2010 | Chang et al. ................... 345/173 |

* cited by examiner

Primary Examiner — Brian Young
(74) Attorney, Agent, or Firm — King & Spalding L.L.P.

(57) ABSTRACT

The invention is based on an input panel and switch device for the operation of an electrical appliance, in particular to realize the input of operating settings in household appliances. This task is solved in accordance with the invention by an input panel for an electrical appliance with an outer-shell structure which as such offers an outer surface for a user to input commands; several separate input sections which are located in the area of the outer surface and assigned to manually selectable input commands; an evaluation circuit to generate switch signals in conjunction with the input commands entered by manual selection of the input sections; whereby a signal sensor circuit is provided in the area of each input section, whereby the signal sensor circuit comprises a receiver electrode and a modulation circuit and whereby via the modulation circuit the input impedance of the receiver electrode is modulated in accordance with a specific pattern for the signal sensor circuit, in particular a data set, and the selection of the input point can be registered via the evaluation circuit with the aid of feedback effects of the modulation of the input impedance of the signal sensor circuit.

17 Claims, 3 Drawing Sheets

Figure 1:
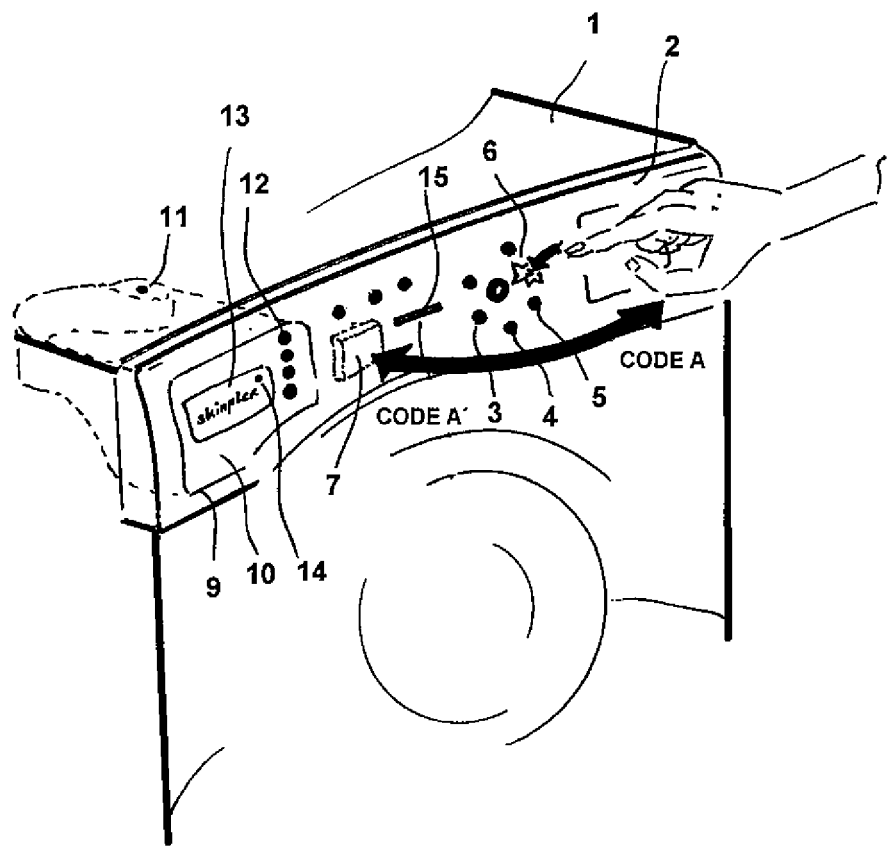

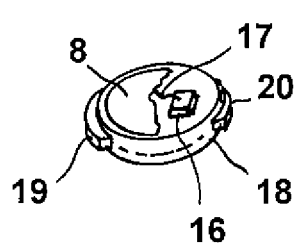
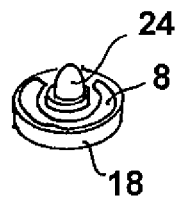
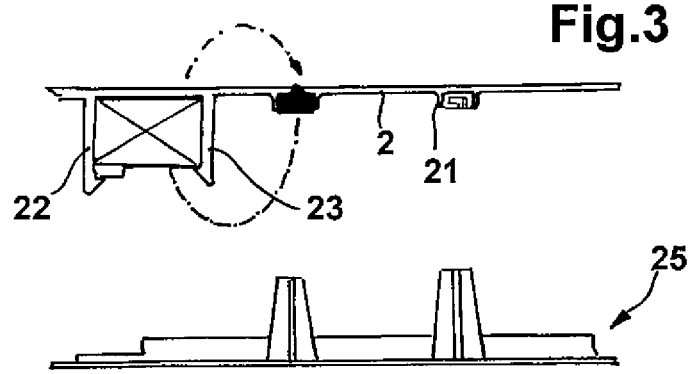
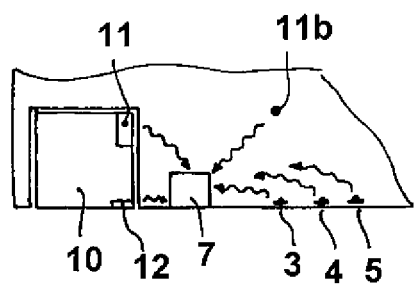

INPUT PANEL AND SWITCH DEVICE FOR THE OPERATION OF AN ELECTRICAL APPLIANCE

CROSS REFERENCE TO RELATED APPLICATIONS

This application is the US national phase of PCT application PCT/EP2008/008421, filed 6 Oct. 2008 and claiming the priority of German patent application 102007047599.5 itself filed 5 Oct. 2007, whose entire disclosures are herewith incorporated by reference.

FIELD OF THE INVENTION

The invention involves an input panel and switch device for the operation of an electrical appliance, in particular to realize the input of operating settings in household appliances.

Electrical appliances, in particular household appliances, are typically equipped with so-called input panels with which entries can be made to determine a work program or other switch settings. In these appliances there is the problem that design-related alterations of these input panels often require considerable alterations to the electronic circuits integrated in them, in particular, the printed circuit board. In addition to this, these circuits are often exposed to environmental influences which can be unfavorable for the service-life of the circuit.

The invention is based on the task of creating solutions with which input panels can be easily and cheaply produced which are distinguished by high functional reliability and also allow a wide scope for the design of the input interface.

This task is solved in accordance with the invention by an input panel for an electrical appliance with
- an outer-shell structure which as such offers an outer surface for a user;
- several separate input sections which are located in the area of the outer surface and allocated to manually selectable input commands;
- an evaluation circuit to generate switch signals in conjunction with the input commands entered by manual selection of the input sections;
- whereby a signal sensor circuit is provided in the area of each input section,
- whereby the signal sensor circuit comprises a receiver electrode and a modulation circuit and
- whereby via the modulation circuit the input impedance of the receiver electrode is modulated in accordance with a specific pattern for the signal sensor circuit, in particular a data set, and the selection of the input point can be registered via the evaluation circuit with the aid of feedback effects of the modulation of the input impedance of the signal sensor circuit.

This makes it advantageously possible to create input panels for electric appliances whose outer appearance can be adapted to current design requirements with a high degree of freedom. The input panel in accordance with the invention can also be assembled with a minimum of assembly and cabling from just a few prefabricated, function-tested, individual components.

The signal sensor circuit provided in the area of each switch zone is preferably realized in such a way that it has its own specific address code and, preferably, an additional or implicit specific address code for a switch family or the whole appliance. The specific address code provided for the individual signal sensor circuits makes the allocation of a switch signal to an input area by the evaluation circuit possible. The family code ensures that no false signals from neighboring appliances of the same or similar kind are registered. The coding is preferably implemented as FSK, PSK or QPSK coding. The signal sensor circuits are supplied with energy via the carrier signal.

The respective signal sensor circuit can be realized in such a way that it can be addressed using its own address code. This makes it possible to call up the selection status of the respective signal sensor circuits by addressing them via the successively output address codes of all signal sensor circuits.

The respective address code can be realized in such a way that it is relatively long, whereby the whole address code does not have to be used for the specification of the signal sensor circuit, but only a part of the address code or the extension as a is stimulation signal onto which the answer signal of the respective signal sensor circuit is modulated by impedance modulation.

The feedback of the selection events detected by the signal sensor circuit can be realized, in particular, by modulation of the input impedance of the electrical system excluding the receiver electrode. The modulation of the input impedance can, in particular, take place when a fulfillment criterion is fulfilled for the specific address code for the respective signal sensor circuit. The modulation of the input impedance can take place in particular when, for example, an 8-bit call-up address is recognized as the correct address. When this criterion is fulfilled, an excitation event present, for example, as a uniform square-wave signal can be processed over a relatively long period of time by the corresponding modulation of the input impedance.

In accordance with a particular aspect of the present invention it is possible to realize each of the signal sensor circuits in such a way that that the address code specific to the respective signal sensor circuit can be read in using a teach mode. This teach mode can, for example, be realized by a defined input signal, preferably on a relatively high necessary signal level. This input signal can be established in such a way that it has to fulfil a certain code pattern.

It is possible to realize the signal sensor circuits to be integrated in the panel first as essentially similar circuits not yet equipped with a circuit-specific code and only to add the specific address code when they are being installed in the input panel, in particular when their physical connection to the input panel has taken place.

The signal sensor circuits can be integrated in a substrate. This substrate can, for example, be a small block body or made as a disc or lens-type structure from a synthetic material. The substrate can be provided with holding geometries which allow easy anchorage of the signal sensor circuit integrated in the substrate on the outer shell body, in particular on the inner side thereof. It is also possible to design the signal sensor circuits or the substrates to accommodate them in such a way that the thus embedded signal sensor circuits can be coupled with the outer shell body by means of an adhesive or welding process (in particular ultrasound welding process.

For especially reliable signal transfer between the evaluation circuit and the respective signal sensor circuits, it is possible to equip the panel in accordance with the invention with a back-wall structure which is fitted as such to the rear area of the outer shell structure facing away from the outer surface. In accordance with a special aspect of the present invention, this back-wall structure is preferably made of an electrically conductive synthetic material or at least provided with an electrically conductive coating. This back-wall structure makes it possible to implement an advantageous integration of the signal sensor circuits in the overall electrical system.

The evaluation circuit in accordance with the invention is preferably executed as a self-contained assembly which can have, for example, a block-type housing. With this block-type housing the evaluation circuit in accordance with the invention can be attached, in particular clipped, to the outer shell structure. It is also possible, however, to fasten the is evaluation circuit onto another structure of the electrical appliance in advance, and to create the overall system in accordance with the invention in which the shell element otherwise fitted with the signal sensor circuits is attached to the electrical appliance. This concept means that even a layperson can realize a broad diversity of device configurations just by changing the cover. The evaluation circuit can be connected by a control line with the appliance control system for the full range of functions. As necessary, after removing the operating cover, the evaluation circuit can also be controlled by another input device, preferably by calling up a special operation code.

On the basis of the concept in accordance with the invention it is, in particular, also possible to integrate signal sensor devices in moving components which can be moved in relation to the operating panel in the course of operating the electrical appliance. In particular, it is possible to integrate signal sensor devices in accordance with the invention in structures such as drawers or inserts, whereby signals can also be generated here via the signal sensor devices which might indicate the filling level of a drawer, in particular a washing powder compartment. It is also possible to use the outer surface or the front of the drawer as a substrate for further input and switch surfaces. The concept in accordance with the invention makes it possible to pick up signals wirelessly from the area of these moving components which can be used as such for the operation of the electrical appliance.

In accordance with a further aspect of the present invention the evaluation circuit also provides an interface over which information can be entered which is provided, for example, is by a data carrier device in the form of a plastic card. This data carrier device can have a signal sensor circuit which allows data transfer on the basis of the same physical interaction principles as are used for the call-up of the operating statuses of the other signal sensor devices of the device panel. This data carrier device can provide data which are necessary, for example, for releasing the appliance for operation or for certain work programs. It is also possible to keep a record of use on this data carrier device to establish later on, for example, which user used the electrical appliance for how long. It is also possible to store certain user-side, for example pre-specified, work programs on the data carrier device so that the electrical appliance in accordance with the invention is configured to work through a certain program, in particular a wash program, as soon as the data carrier device is inserted.

The concept in accordance with the invention for the generation of switch signals which are necessary as such for the operation of an electrical appliance is particularly suitable for household appliance such as washing machines and dishwashers or electric ovens. However, the concept in accordance with the invention also makes it possible to provide relatively low-cost switch systems for other electrical appliances, such as screens and communication devices such as phones.

The signal sensor circuits in accordance with the invention can be executed as tiny ASIC structures which can be integrated in relatively small plastic or ceramic bodies. These ASIC structures can be designed in such a way that that they allow a signal transfer over a range of 10 to 300 mm. The signal sensor circuits can be designed in such a way that they have to register a certain level increase and then the passing of a threshold value before outputting a switch signal. To this extent it is possible to execute relatively extensive signal preparation procedures with just the structures realized on the ASIC of the signal sensor circuit.

The evaluation circuit in accordance with the invention can also be executed as a standard structure which can be coupled, for example, via a USB plug system to a central control device of the appliance and otherwise only has to be arranged with sufficient proximity to the signal sensor circuits in accordance with the invention in order to allow the corresponding signal transfer. Preferably the evaluation circuit in accordance with the invention is arranged as centrally as possible in the panel fitted with the signal sensor circuits in accordance with the invention in order to realize minimum signal transmission distances.

The energy supply to the signal sensor circuits in accordance with the invention can be realized directly from the dielectric current events generated by the evaluation circuit. It is possible to provide small energy storage units in the area of the signal sensor circuits, for example in the form of a gold cap, with which energy storage can be realized which would allow, for example, the temporary operation of lights.

In accordance with a special aspect of the present invention, the signal sensor circuit in accordance with the invention can be executed as a miniature assembly which, alongside the actual core circuit necessary for signal transmission, also includes lights, for example in the form of LEDs. The signal sensor circuit can be operated in such a way that, on fulfillment of a certain proximity criterion, these first light up in a certain color, for example green, and then flash significantly in a different color, for example red, when the switch criterion is fulfilled. It is possible to implement photodiode systems on this signal sensor circuit which, for example, could allow an additional energy supply to the signal sensor circuit from ambient or other light. It is also possible to provide several diode systems designed to emit light in a wide range of colors on the signal sensor circuit, whereby the light characteristics of this signal sensor circuit can be established in the course of a teach mode after the signal sensor circuit has been installed in the input panel.

Figure 6:
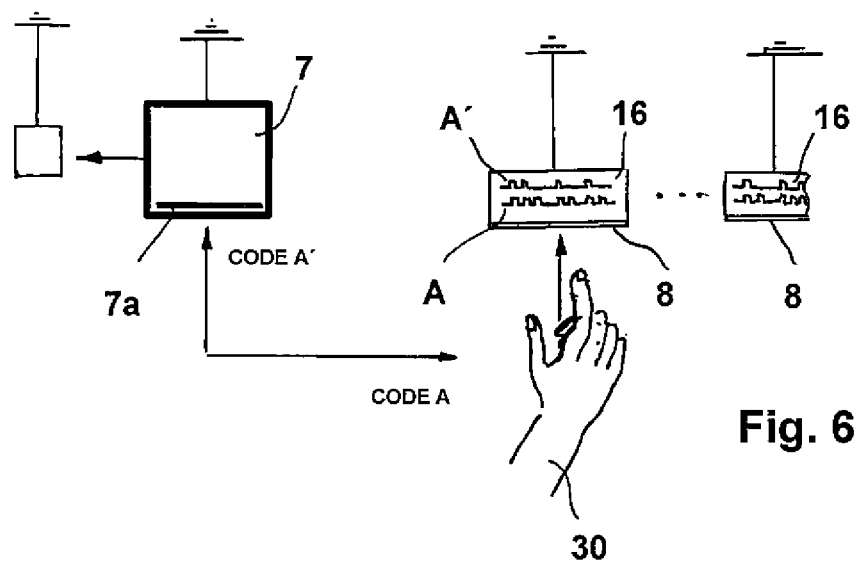
Figure 7:
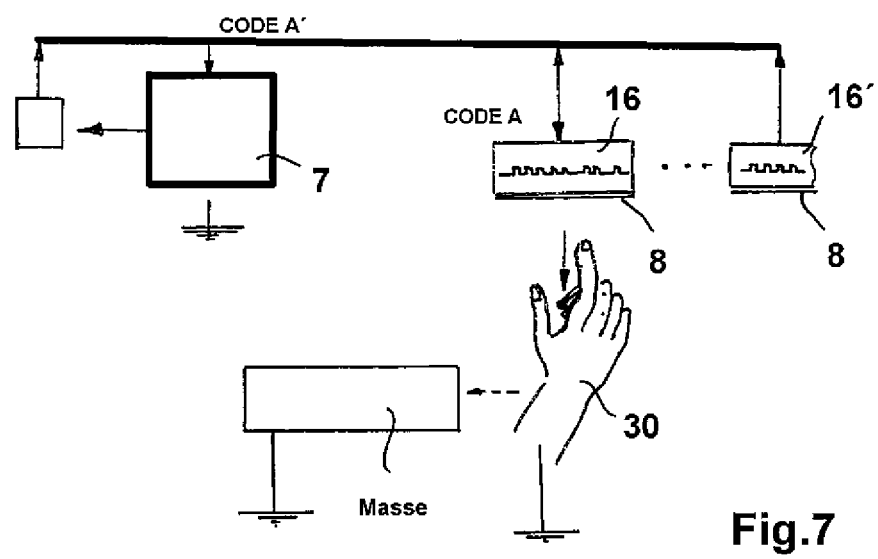

Further details and features of the invention are set out in the following description in conjunction with the drawings. These are as follows:

FIG. 1 a perspective drawing to illustrate the function and structure of an input panel accordance with the invention—here as an input panel for a washing machine, FIG. 2a a perspective drawing to illustrate the design of a signal sensor circuit in accordance with the invention as a flat, disc-type miniature element, FIG. 2b a version of a signal sensor circuit in accordance with the invention, executed as a miniature assembly, here with a light realized by a diode, FIG. 3 a drawing to illustrate the connection of a signal sensor circuit in accordance with the invention to a device panel with evaluation circuit, FIG. 4 a drawing to illustrate a back-wall structure for an input panel in accordance with the invention, FIG. 5 a basic diagram to illustrate signal transfer paths for an electrical appliance—here a washing machine with additional washing powder compartment, FIG. 6 a basic diagram to further illustrate the signal transfer in the input panel in accordance with the invention, FIG. 7 a further diagram to illustrate an alternative version of the processing of the signal transfer.

The electrical appliance 1 shown in FIG. 1 is equipped with an input panel 2, which is made here from a synthetic material and, as can be seen here, which offers an outer surface for a user to input commands. In the area of this outer surface there are several input sections 3,4,5,6, shown here as switch points, which as such serve for the generation of switch signals necessary for the operation of the electrical appliance 1.

In the area of the input panel 2 there is an evaluation circuit 7, shown here as a small box, which as such serves for the registration of switch statuses which are set in interaction with the input operations executed via the input sections 3,4,5,6.

In the area of the respective input points there is a signal sensor circuit, which is not shown here. Each signal sensor circuit includes a tiny registration electrode and a modulation circuit realized in the form of an ASIC.

This modulation circuit is designed in such a way that it can modulate the input impedance of the registration electrode (see FIG. 2a, reference no. 8). The evaluation circuit is designed in such a way that it can register the alterations of the input impedance of the respective registration electrode 8 made by the modulation circuit. This means that it is possible to feed back signal sequences from the area of the signal sensor circuits, in particular data sets (CODE A'), to the area of the evaluation circuit. On the basis of these signal sequences it can then be established in the area of the evaluation circuit whether an input point has been selected.

The outer shell 2 of the input panel is preferably made of a plastic material in accordance with the appliance design. In the area of the input points assigned to the individual signal sensor circuits, structures can be realized which as such are similar to conventional switches buttons in terms of their appearance and also offer the same haptic effects. The evaluation circuit can be provided with a sound generator which accompanies the selection process acoustically with a typical switching sound, e.g. a click. Otherwise it is also possible to only color-code the switch function sections in the area of the outer shell. This type of color coding can be implemented in particular by active coloring of the synthetic material used to form the outer shell. Thus it is possible, in particular, to apply the corresponding switch symbols to the outer shell by laser engraving.

In the embodiment example shown here, there is a cutout 9 provided in the area of the input panel into which a drawer— here a washing powder drawer 10—is inserted. This drawer 10 also has signal sensor circuits 11, 12, via which certain system statuses such as "complete insertion" of the drawer, "filling level of the drawer", can be registered. It is also possible to provide further signal sensor circuits 12 via which manual input operations can take place in the same way as in the rest of the input panel. This makes it possible to harness the front surface area of this washing powder drawer as a substrate area for the input switch. It is also possible to attach certain additional facilities to the input panel such as here, for example, a type plate 13, whereby this type plate 13 can also contain a signal sensor circuit 14, which transfers certain information to the evaluation circuit 7 and thus, for example, realizes a certain configuration status in this.

It is also possible to realize a signal transfer via the evaluation circuit 7 to other data carrier systems, in particular a data carrier card which can be inserted in a slot 15.

The evaluation circuit 7 thus offers a central data registration module with the aid of which the signal sensor circuits arranged in the proximity of the evaluation circuit can be addressed and called up wirelessly.

As shown in FIG. 2a, it is possible to realize the signal sensor circuit in accordance with the invention by an ASIC component 16, which can be connected by a short connection line 17 or, as applicable, directly to a receiver electrode 8. In the embodiment example shown here, the receiver electrode 8 is executed as a thin metal platelet which as such offers a relatively large, free electrode surface to the switch point area. The signal sensor circuit 16 is integrated in a substrate 18. This substrate 18 is provided with anchoring structures 19, 20, with which it can be easily anchored in the back of the input panel 2 in accordance with the invention. The signal sensor circuit 16 in accordance with the invention can, as the diagram shows, be part of a small, button-type assembly which can be attached as a fully encapsulated unit to a point of an operating panel suitable for the realization of a switch point.

As is shown in FIG. 2b, the signal sensor circuits 3, 4, 5 in accordance with the invention can be designed in such a way that they are also equipped, for example, with lights with which optical signals can be perceived through the outer shell. FIG. 2b shows a version of the signal sensor device in accordance with the invention which has essentially the same structure as the signal sensor device in accordance with FIG. 2a and is also equipped with an optical display facility, formed here by a light-emitting diode 24. This LED 24 is located directly on the substrate which also accommodates the signal sensor circuit executed as an ASIC. In the proximity of the LED 24 there is a receiver electrode device 8, executed here as a ring segment.

As can be seen in FIG. 3, it is possible to provide fastening structures 21 in the rear area of the operating panel 2, to allow especially simple anchorage of the signal sensor circuits in accordance with the invention (see FIG. 2a). Further fastening structures 22, 23 can also be provided in the input panel 2, particularly in the back of it, with the aid of which the evaluation circuit 7, which is preferably executed as a block structure, can be anchored.

FIG. 4 is a highly simplified diagram of a back-wall structure 25 which, for example, can be placed on the back of the outer shell, thus covering the other structures attached to the rear of the outer shell, here the signal sensor circuits and the evaluation circuit. It is possible to execute this structural component 25 in an electrically conductive synthetic material or some other material which can be made conductive, so that, for example, a signal transfer path is realized between the evaluation circuit and the signal sensor circuit in the form of a is grounding bus via this conductive structure.

FIG. 5 is a highly simplified diagram of various options for the realization of a wireless signal transfer between input points of the input panel, signal generation points 11, 11b buried deeper in the device, as well as an input device 12 connected to a mobile insert 10. Other signals from the inside of the electrical appliance, e.g. the water temperature, sieve information or washing powder filling level, can be called up via the evaluation circuit 7 in accordance with the invention.

FIG. 6 shows an embodiment example in which via a send electrode device 7a—not further specified here—which is connected to the evaluation circuit 7, a dielectric current event is coupled in a user 30 which carries the data code A indicated here in simplified form as a square-wave signal. Insofar as this data code A coupled into the user 30 fulfils a certain criterion, e.g. a binary code, the input impedance of a receiver electrode 8 of the signal sensor circuit 16 can be modulated. This means that it is possible to send a data telegram CODE A' carrying information content to the evaluation circuit 7.

The input panel in accordance with the invention is, as mentioned above, equipped with several such signal sensor circuits 16, 16', which are preferably addressed by different addresses, whereby depending on the manual selection made by the user—which is manifested in a significant alteration of the dielectric characteristics of the area of the respective receiver electrode device 8—of the individual signal sensor circuits, the corresponding data telegrams CODE A' can be fed back to the evaluation circuit 7. As mentioned above, other signals from signal receiver areas inside the appliance can also be called up via the evaluation circuit 7. These signals can be brought back to the area of the evaluation circuit 7 in accordance with the same physical interaction principle as applies for the registration of switch operations via the signal sensor circuits 16, 16'.

FIG. 7 shows a version for the processing of the signal transfer in accordance with the invention, in which the individual signal sensor circuits 16, 16' are coupled with the evaluation circuit 7 with good conduction or relatively good capacitance.

The switch signals in this version are generated in such a way that when the user 30 approaches the respective, selected signal sensor circuit 16 or 16' the grounding is improved, so that a signal transfer to the area of the evaluation circuit 7 can be realized via the modulation circuit of the signal sensor circuit.

With regard to the structure of the evaluation circuit and of the signal sensor circuits, attention is drawn in particular to the patent application of the applicant DE 10 2006 046 515.6. The disclosure content of this application is fully included in the present patent application by the reference made to it here.

The signal sensor circuits can be executed in such a way that they can only be used to effect on/off states. It is also possible to execute these signal sensor circuits in such a way that they can be used for area selection. In particular for the realization of an area selection it is possible to process signals of several signal sensor circuits in combination and thus, for example, on the basis of different coupling intensities, to recognize intermediate positions of the index finger of a user between these signal sensor circuits and to interpolate intermediate values or to calculate them by means of other evaluation approaches. It is also possible to register setting statuses of physically operable structures, e.g. adjustment knobs or sliders, with the aid of a signal sensor circuit assigned to these structures, and to realize the further signal transfer on a field basis, i.e. by modulation of a quasistatic alternating field as a signal from the evaluation circuit, preferably as a numerical value in binary code or via a signal sequence carrying address information.

The invention claimed is:

1. An input panel for an electrical appliance with an outer shell structure which as such offers an outer surface for a user to input commands;
    several separate input sections which are located in the area of the outer surface and to which manually selectable input commands are assigned;
    an evaluation circuit for the generation of switch signals in conjunction with the input commands entered by manual selection of the input sections;
    whereby a signal sensor circuit is provided in the area of the respective input section,
    whereby the signal sensor circuit includes a receiver electrode and a modulation circuit, and
    whereby via the modulation circuit the input impedance of the receiver electrode is modulated in accordance with a specific pattern for the signal sensor circuit, wherein each signal sensor circuit has its own specific address code and/or can be addressed via their address code, and the selection of the input point can be registered via the evaluation circuit with the aid of feedback effects of the modulation of the input impedance of the signal sensor circuit.

2. The input panel in accordance with claim 1 wherein each signal sensor circuit has a specific family address code for a signal sensor family.

3. The input panel in accordance with claim 1 wherein the input impedance is only modulated by a signal sensor circuit if a fulfillment criterion for the address code of the signal sensor circuit is fulfilled.

4. The input panel in accordance with claim 1 wherein the address code for the respective signal sensor circuit is assigned to it in the course of a teach mode.

5. The input panel in accordance with claim 4 wherein this teach mode is realized by a defined input signal at the receiver electrode.

6. The input panel in accordance with claim 5 wherein the input signal necessary to realize the teach mode requires a voltage level which is higher than the voltage level occurring within the framework of operation of the input panel.

7. An input panel for an electrical appliance with an outer shell structure which as such offers an outer surface for a user to input commands;
    several separate input sections which are located in the area of the outer surface and to which manually selectable input commands are assigned;
    an evaluation circuit for the generation of switch signals in conjunction with the input commands entered by manual selection of the input sections;
    whereby a signal sensor circuit is provided in the area of the respective input section,
    whereby the signal sensor circuit includes a receiver electrode and a modulation circuit, and
    whereby via the modulation circuit the input impedance of the receiver electrode is modulated in accordance with a specific pattern for the signal sensor circuit, and the selection of the input point can be registered via the evaluation circuit with the aid of feedback effects of the modulation of the input impedance of the signal sensor circuit wherein the signal sensor circuits are integrated in a substrate and wherein the substrate body is executed as a small block body or as a disk, bead or lens-type structure.

8. The input panel in accordance with claim 7 wherein the substrate body is executed as a small block body or as a disk, bead or lens-type structure.

9. The input panel in accordance with claim 8, wherein the substrate is equipped with holding geometries which allow the anchorage of the substrate on the outer shell body.

10. The input panel in accordance with claim 9 wherein the substrate can be coupled with the outer shell body by means of an adhesive or welding process.

11. An input panel for an electrical appliance with an outer shell structure which as such offers an outer surface for a user to input commands;
    several separate input sections which are located in the area of the outer surface and to which manually selectable input commands are assigned;
    an evaluation circuit for the generation of switch signals in conjunction with the input commands entered by manual selection of the input sections;
    whereby a signal sensor circuit is provided in the area of the respective input section,
    whereby the signal sensor circuit includes a receiver electrode and a modulation circuit, and
    whereby via the modulation circuit the input impedance of the receiver electrode is modulated in accordance with a specific pattern for the signal sensor circuit, and the selection of the input point can be registered via the evaluation circuit with the aid of feedback effects of the modulation of the input impedance of the signal sensor circuit, wherein a back-wall structure is provided which is placed on the rear of the outer shell structure facing away from the outer surface.

12. The input panel in accordance with claim 2 wherein a back-wall structure is made of an electrically conductive synthetic material.

13. An input panel for an electrical appliance with an outer shell structure which as such offers an outer surface for a user to input commands;
several separate input sections which are located in the area of the outer surface and to which manually selectable input commands are assigned;
an evaluation circuit for the generation of switch signals in conjunction with the input commands entered by manual selection of the input sections;
whereby a signal sensor circuit is provided in the area of the respective input section,
whereby the signal sensor circuit includes a receiver electrode and a modulation circuit, and
whereby via the modulation circuit the input impedance of the receiver electrode is modulated in accordance with a specific pattern for the signal sensor circuit, and the selection of the input point can be registered via the evaluation circuit with the aid of feedback effects of the modulation of the input impedance of the signal sensor circuit, wherein the evaluating circuit has an interface device with which the switch operations registered by the evaluation circuit can be fed to a control system.

14. An input panel for an electrical appliance with an outer shell structure which as such offers an outer surface for a user to input commands;
several separate input sections which are located in the area of the outer surface and to which manually selectable input commands are assigned;
an evaluation circuit for the generation of switch signals in conjunction with the input commands entered by manual selection of the input sections;
whereby a signal sensor circuit is provided in the area of the respective input section,
whereby the signal sensor circuit includes a receiver electrode and a modulation circuit, and
whereby via the modulation circuit the input impedance of the receiver electrode is modulated in accordance with a specific pattern for the signal sensor circuit, and the selection of the input point can be registered via the evaluation circuit with the aid of feedback effects of the modulation of the input impedance of the signal sensor circuit, wherein the input panel is integrated in an electrical appliance and wherein the electrical appliance includes a moving component, for example a drawer or a door, and that the evaluation circuit is integrated in such a way in the electrical appliance that signals can be registered by the evaluation circuit which are generated by the signal sensor devices integrated in the moving component.

15. The input panel in accordance with claim 14 wherein the signal sensor devices assigned to those moving components are equipped with sensor systems with which statuses of the moving component, e.g. the insertion or closing position or a filling level, can be registered.

16. An input panel for an electrical appliance with an outer shell structure which as such offers an outer surface for a user to input commands;
several separate input sections which are located in the area of the outer surface and to which manually selectable input commands are assigned;
an evaluation circuit for the generation of switch signals in conjunction with the input commands entered by manual selection of the input sections;
whereby a signal sensor circuit is provided in the area of the respective input section,
whereby the signal sensor circuit includes a receiver electrode and a modulation circuit, and
whereby the signal sensor circuit includes a receiver electrode and a modulation circuit, and
whereby via the modulation circuit the input impedance of the receiver electrode is modulated in accordance with a specific pattern for the signal sensor circuit, and the selection of the input point can be registered via the evaluation circuit with the aid of feedback effects of the modulation of the input impedance of the signal sensor circuit, wherein the evaluation circuit provides a data input interface with which information can be entered which is provided by a mobile data carrier device held by the user.

17. The input panel in accordance with claim 16 wherein the data carrier device is executed as a plastic card-type element and that the electrical appliance is provided with a facility, in particular an insertion slot, to accept the data carrier device.

* * * * *